(12) United States Patent
Takahashi

(10) Patent No.: US 7,696,807 B2
(45) Date of Patent: Apr. 13, 2010

(54) SEMICONDUCTOR INTEGRATED CIRCUIT WITH INPUT BUFFER HAVING HIGH VOLTAGE PROTECTION

(75) Inventor: Shuichi Takahashi, Gunma (JP)

(73) Assignees: SANYO Electric Co., Ltd., Osaka (JP); SANYO Semiconductor Co., Ltd., Gunma (JP)

( * ) Notice: Subject to any disclaimer, the term of this patent is extended or adjusted under 35 U.S.C. 154(b) by 97 days.

(21) Appl. No.: 11/946,525

(22) Filed: Nov. 28, 2007

(65) Prior Publication Data
US 2008/0143428 A1  Jun. 19, 2008

(30) Foreign Application Priority Data
Nov. 30, 2006  (JP) ............... 2006-323024

(51) Int. Cl.
H03K 17/16  (2006.01)
H03K 17/30  (2006.01)

(52) U.S. Cl. ............ 327/379; 327/108; 327/109; 327/110; 327/111; 327/112; 326/82; 326/83; 326/86

(58) Field of Classification Search .......... 327/108, 327/109, 110, 111, 112, 379; 326/82, 83, 326/86
See application file for complete search history.

(56) References Cited

U.S. PATENT DOCUMENTS

| | | | |
|---|---|---|---|
| 4,829,203 A * | 5/1989 | Ashmore, Jr. ............ | 365/185.1 |
| 5,734,366 A * | 3/1998 | Kubota et al. ............ | 345/100 |
| 5,751,177 A * | 5/1998 | Tanoi .................... | 327/333 |
| 5,777,504 A * | 7/1998 | Chu et al. ............... | 327/379 |
| 6,377,086 B1 * | 4/2002 | Bays et al. ............... | 327/109 |
| 6,850,108 B2 * | 2/2005 | Shin .................... | 327/319 |
| 7,307,455 B2 * | 12/2007 | Choi et al. .............. | 326/82 |

FOREIGN PATENT DOCUMENTS

| | | |
|---|---|---|
| JP | 5-327465 | 12/1993 |
| JP | 09-093115 | 4/1997 |
| JP | 09-172146 | 6/1997 |
| KR | 10-2004-0051420 | 6/2004 |

* cited by examiner

Primary Examiner—Lincoln Donovan
Assistant Examiner—John W Poos
(74) Attorney, Agent, or Firm—Morrison & Foerster LLP

(57) ABSTRACT

A high voltage reception terminal is formed in a semiconductor integrated circuit without increasing the number of manufacturing processes and the manufacturing cost. A transfer gate configured from a NMOS, which is the high withstand voltage transistor, and a pull-up resistor are formed. An input terminal of the transfer gate is connected to the high voltage reception terminal and an output terminal of the transfer gate is connected to a CMOS inverter through an input resistor. One end of the pull-up resistor is connected to the output terminal of the transfer gate and the other end of the pull-up resistor receives source voltage VDD (5V). The transfer gate lowers the inputted high voltage VX (VX>VDD) to VDD-Vt1'. The pull-up resistor biases the voltage at the output terminal of the transfer gate to VDD and boosts the voltage at the output terminal that has been lowered by the transfer gate to about VDD.

4 Claims, 3 Drawing Sheets

SEMICONDUCTOR INTEGRATED CIRCUIT WITH INPUT BUFFER HAVING HIGH VOLTAGE PROTECTION

CROSS-REFERENCE OF THE INVENTION

This application claims priority from Japanese Patent Application No. 2006-323024, the content of which is incorporated herein by reference in its entirety.

BACKGROUND OF THE INVENTION

1. Field of the Invention

This invention relates to a semiconductor integrated circuit, especially to the semiconductor integrated circuit with a high voltage reception terminal to which a positive high voltage that is higher than the power source voltage or a negative high voltage that is lower than the ground voltage is applied.

2. Description of the Related Art

A high voltage reception terminal, to which a positive high voltage that is higher than the power source voltage is applied, has been formed in a semiconductor integrated circuit such as micro computer. FIG. 5 shows the circuit diagram of the semiconductor integrated circuit with the high voltage reception terminal. When the power source voltage VDD of the semiconductor integrated circuit is 5V, an input voltage of 0-12V is applied to the high voltage reception terminal 50. A CMOS inverter 52 (input buffer) is connected to the high voltage reception terminal 50 though an input resistor 51. The CMOS inverter 52 includes a P channel type MOS transistor (refereed to as the PMOS hereinafter) (T1) and an N channel type MOS transistor (referred to as the NMOS hereinafter) (T2) and the gates of these transistors receive an input voltage coming from the high voltage reception terminal 50. An output transistor 53, which is a high withstand voltage transistor NMOS (T3), is also connected to the high voltage reception terminal 50. When the output transistor 53 is used, the voltage of 0-12V also appears in the high voltage reception terminal 50.

The withstand voltage of the gates of the PMOS (T1) and the NMOS (2) of the CMOS inverter 52 is set higher than 12V and the withstand voltage of the drain of the NMOS (T3) of the output transistor 53 is also set higher than 12V.

The gate insulation film is formed thicker than the MOS transistor supplied with the power source voltage VDD (VDD=5V) in order to secure the withstand voltage of the gate of the PMOS (T1) and the NMOS (T2). However, when the gate insulation film is thicker, the threshold voltage Vt goes up, leading to the smaller margin of the input voltage range of the CMOS inverter 52 when the power source voltage VDD is low.

Therefore, the manufacturing process of ion doping for adjusting the threshold voltage is added in order to lower the Vt of the PMOS (T1) and the NMOS (T2).

The input-output circuit of the semiconductor integrated circuit is described in Japanese Patent Application Publication Nos. H09-093115 and H09-172146.

However, the number of manufacturing processes increases, when the process of ion doping for adjusting the threshold voltage for lowering the Vt of the PMOS (T1) and the NMOS (T2) is added, leading to the higher manufacturing cost.

SUMMARY OF THE INVENTION

The semiconductor integrated circuit of this invention is directed to solve the problem stated above. The semiconductor integrated circuit of this invention has a high voltage reception terminal receiving a positive high voltage higher than a power source voltage and a transfer gate. The transfer gate is configured with a first MOS transistor of an N channel type withstanding the positive high voltage. The input terminal of the first MOS transistor is connected to the high voltage reception terminal and the power source voltage is applied to a gate of the first MOS transistor. The semiconductor integrated circuit of this invention also has an input buffer including a second MOS transistor, a gate of which is connected to an output terminal of the transfer gate and a pull-up device connected to the output terminal of the transfer gate and biasing the output terminal to the power source voltage.

A high voltage is not applied to the gate of the MOS transistor of the input buffer even if a high voltage is applied to the high voltage reception terminal because the high voltage is lowered by the transfer gate in the semiconductor integrated circuit of this invention. Therefore, it is not necessary to form a thicker gate insulation film for the MOS transistor of the input buffer. The omission of the ion doping process for the adjustment of the threshold voltage can lead to the reduction of the number of the manufacturing processes and the lower manufacturing cost.

DETAILED DESCRIPTION OF THE INVENTION

Next, the semiconductor integrated circuit of the embodiment of this invention will be explained by referring to figures.

Figure 1:
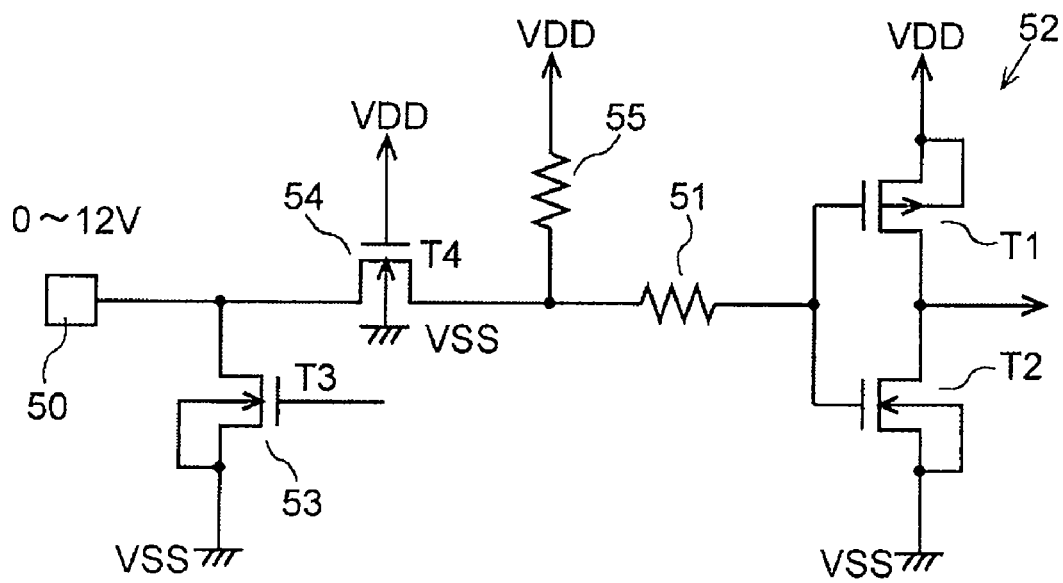
FIG. 1 shows a circuit diagram of the semiconductor integrated circuit of the first embodiment of this invention.

FIG. 1 is a figure showing the circuit diagram of the semiconductor integrated circuit of a first embodiment of this invention. The same reference numerals are given to the same portions as those in the semiconductor integrated circuit shown in FIG. 5. The explanation on those portions will be omitted.

Figure 5:
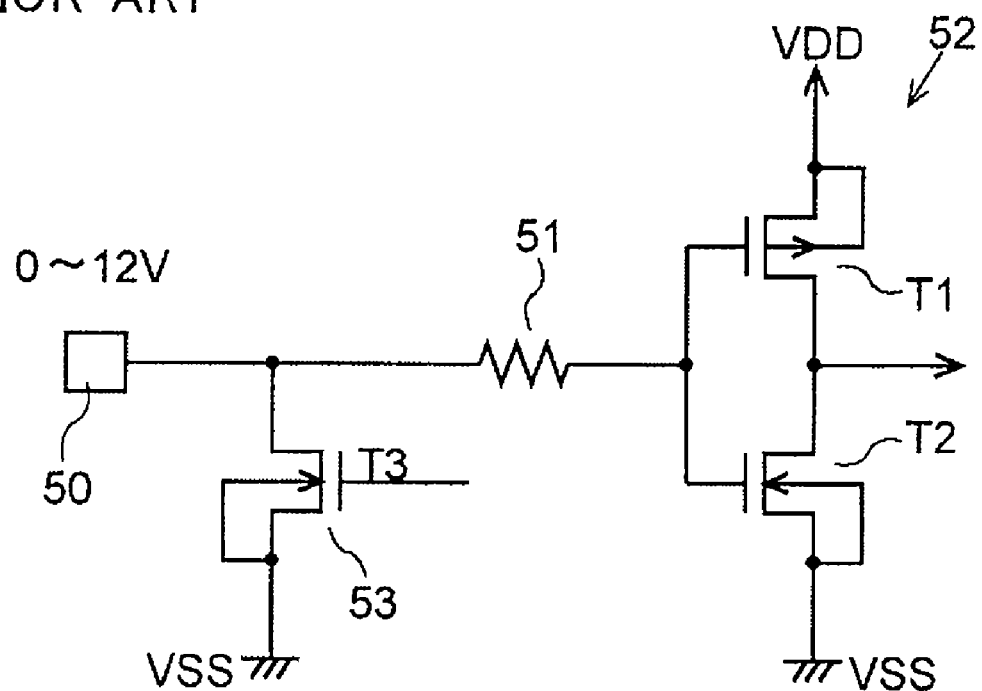
FIG. 5 shows a circuit diagram of the semiconductor integrated circuit of prior arts.

In this circuit, a transfer gate 54, which is a high withstand voltage transistor NMOS (T4) withstanding the positive high voltage higher than the power source voltage VDD, and a pull-up resistor 55 are provided, as shown in FIG. 5. The input terminal of the transfer gate 54 is connected to a high voltage reception terminal 50, and the output terminal of the transfer gate 54 is connected to a CMOS inverter 52 through an input resistor 51. The threshold voltage of the CMOS inverter is usually set around 0.5VDD. One end of the pull-up resistor 55 is connected to the output terminal of the transfer gate 54 and the power source voltage VDD (5V) is applied to the other end of the pull-up resistor 55. A pull-up transistor may be provided in stead of the pull-up resistor 55.

The voltage at the output terminal of the transfer gate 54 becomes VDD-Vt1' when the high voltage VX, that is higher than VDD, is applied to the high voltage reception terminal 50 (and when there is no pull-up resistor 55). Vt1' is the threshold voltage of the transfer gate 54 with a back gate bias applied to it. Since the back gate of the transfer gate 54 is set to the ground voltage VSS (=0V) in this example, the back gate bias is equal to the high voltage VX. That is, the transfer gate 54 lowers the inputted high voltage VX (VX>VDD) to the VDD−Vt1'. The pull-up resistor 55 biases the voltage of the output terminal of the transfer gate 54 and the voltage of the output terminal lowered by the transfer gate 54 will be increased to about VDD.

When the low voltage of L level, for example 0V, is applied to the high voltage reception terminal 50 and when the resistor value of the pull-up resistor 55 is RU and the resistor value of the transfer gate 54 is RT, the voltage of the output terminal of the transfer gate 54 is as follows:

The Voltage of The Output Terminal of The Transfer Terminal 54=RT·VDD/(RU+RT)

If RU is extremely larger than RT (RU>>RT), the voltage of the output terminal of the transfer gate 54 is almost equal to zero (the voltage of the output terminal of the transfer gate 54 ≈0V), eliminating the influence of the pull-up resistor 55 toward the voltage of the output terminal of the transfer gate 54.

Figure 2:
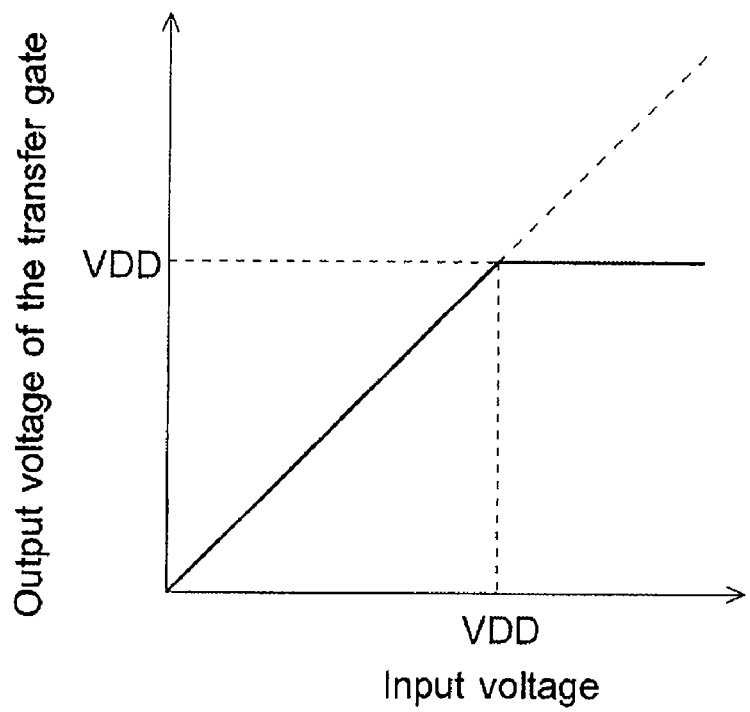
FIG. 2 shows the characteristic of the output and input of the semiconductor integrated circuit of the first embodiment of this invention.

The correlation between the input voltage (=the voltage applied to the high voltage reception terminal 50) and the output voltage of the transfer gate 54 (=the input voltage of the CMOS inverter 52) is shown in FIG. 2. Only the voltage ranging from 0V to VDD is applied to the CMOS inverter 52, as shown in the figure. Therefore, the gate insulation film of the PMOS (T1) and NMOS (T2) of the CMOS inverter 52 can be formed in such way that the thickness of the film should be the same as that of the MOS transistor supplied with the power source voltage VDD, preventing the increase of the threshold voltage. Thus, the process of ion doping for adjusting the threshold voltage can be omitted, leading to the reduced number of the manufacturing processes and the reduced manufacturing cost.

Although the semiconductor integrated circuit of this embodiment has both input and output functions, it is also possible to form only input function omitting forming the output transistor 53.

Figure 3:
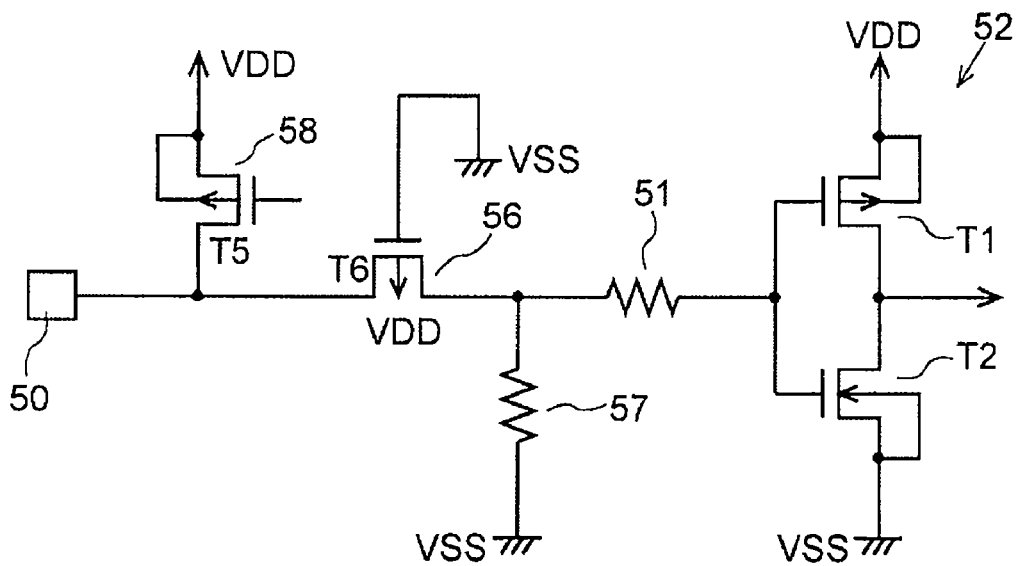
FIG. 3 shows a circuit diagram of the semiconductor integrated circuit of the second embodiment of this invention.

FIG. 3 is a circuit diagram of the semiconductor integrated circuit of a second embodiment of this invention. The difference of this embodiment from the first embodiment is that the a negative high voltage which is lower than the ground voltage VSS (=0V) is applied to the high voltage reception terminal 50. Thus, a transfer gate 56, which is a high withstand voltage transistor PMOS (T6) withstanding the negative high voltage lower than the ground voltage VSS, and a pull-down resistor 57 instead of the pull-up resistor 55 are provided, and an output transistor 58, which is a high withstand voltage transistor, is also provided. The ground voltage VSS is applied to the gate of the PMOS (T6).

The voltage at the output terminal of the transfer gate 56 is Vt2' when the high voltage VY, which is lower than VSS, is applied to the high voltage reception terminal 50 (if there is no pull-down resistor 57). Vt2' is the threshold voltage of the transfer gate 56 with a back gate bias applied to it. Since the back gate of the transfer gate 56 is set to the power source voltage VDD in this example, the back gate bias is equal to the voltage VDD. That is, the transfer gate 56 boosts the inputted high voltage VY (VX>VSS) to the Vt2'. The pull-down resistor 57 biases the voltage of the output terminal of the transfer terminal 56 and the voltage of the output terminal boosted by the transfer gate 56 will be lowered to about VSS.

When the voltage of H level, for example VDD, is applied to the high voltage reception terminal 50 and when the resistor value of the pull-down resistor 57 is RD and the resistor value of the transfer gate 56 is RT, the voltage of the output terminal of the transfer gate 56 is as follows:

The Voltage of the Output Terminal of The Transfer Terminal 56=RD·VDD/(RT+RD)

If RD is extremely larger than RT (RD>>RT), the voltage of the output terminal of the transfer gate 56 is almost equal to VDD, eliminating the influence of the pull-down resistor 57 toward the voltage of the output terminal of the transfer gate 56.

Figure 4:
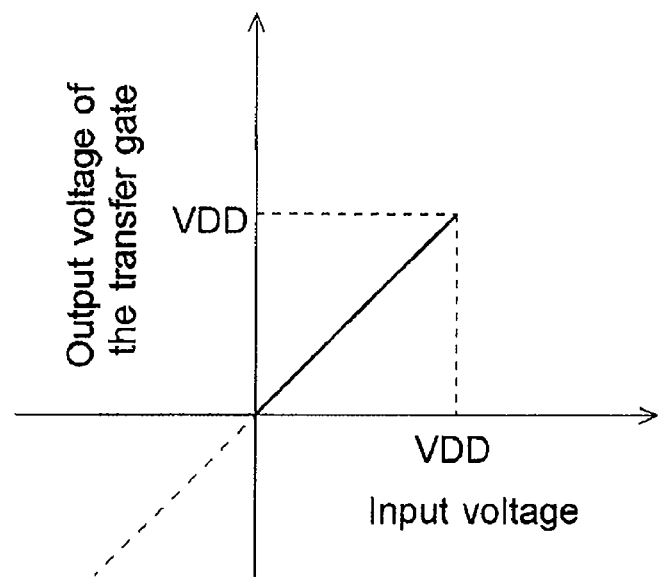
FIG. 4 shows the characteristic of the output and input of the semiconductor integrated circuit of the second embodiment of this invention.

The correlation between the input voltage (=the voltage applied to the high voltage reception terminal 50) and the output voltage of the transfer gate 56 (=the input voltage of the CMOS inverter 52) is shown in FIG. 4. Only the voltage ranging from 0V to VDD is applied to the CMOS inverter 52, as shown in the figure. Therefore, the gate insulation film of the PMOS (T1) and NMOS (T2) of the CMOS inverter 52 can be formed in such way that the thickness of the film is the same as that of the MOS transistor supplied with the power source voltage VDD, preventing the increase of the threshold voltage. Thus, the process of ion doping for adjusting the threshold voltage can be omitted, leading to the reduced number of the manufacturing processes and the reduced manufacturing cost.

Although the semiconductor integrated circuit of this embodiment has both input and output functions, it is also possible to form only input function omitting forming the output transistor 58.

The semiconductor integrated circuit of this invention enables the forming of the high voltage reception terminal without increasing the manufacturing processes or manufacturing cost.

What is claimed is:

1. A semiconductor integrated circuit comprising:
   a high voltage reception terminal receiving a negative high voltage lower than a ground voltage;
   a transfer gate comprising a first MOS transistor of an P channel type withstanding the negative high voltage, the first MOS transistor comprising an input terminal electrically connected to the high voltage reception terminal and a gate receiving the ground voltage;
   an input buffer comprising a second MOS transistor comprising a gate electrically connected to an output terminal of the first MOS transistor; and
   a pull-down device electrically connected to the output terminal of the first MOS transistor and biasing the output terminal to the ground voltage,
   wherein the high voltage reception terminal and the transfer gate are connected directly so that no transistor intersects a current path between the high voltage reception terminal and the transfer gate.

2. The semiconductor integrated circuit of claim 1, further comprising an output transistor comprising a third MOS transistor of a P channel type withstanding the negative high voltage and electrically connected to the high voltage reception terminal.

3. A semiconductor integrated circuit comprising:
   a high voltage reception terminal receiving a positive high voltage higher than a power source voltage;
   a transfer gate comprising a first MOS transistor of an N channel type withstanding the positive high voltage, the first MOS transistor comprising an input terminal electrically connected to the high voltage reception terminal and a gate receiving the power source voltage;

an input buffer comprising a second MOS transistor comprising a gate electrically connected to an output terminal of the first MOS transistor; and
a pull-up device electrically connected to the output terminal of the first MOS transistor and biasing the output terminal to the power source voltage,
wherein a resistance of the pull-up device is sufficiently higher than a resistance of the transfer gate that a voltage at the output terminal of the first MOS transistor becomes substantially a ground voltage when the ground voltage is applied to the high voltage reception terminal.

4. A semiconductor integrated circuit comprising:
a high voltage reception terminal receiving a negative high voltage lower than a ground voltage;
a transfer gate comprising a first MOS transistor of an P channel type withstanding the negative high voltage, the first MOS transistor comprising an input terminal electrically connected to the high voltage reception terminal and a gate receiving the ground voltage;
an input buffer comprising a second MOS transistor comprising a gate electrically connected to an output terminal of the first MOS transistor; and
a pull-down device electrically connected to the output terminal of the first MOS transistor and biasing the output terminal to the ground voltage,
wherein a resistance of the pull-down device is sufficiently higher than a resistance of the transfer gate that a voltage at the output terminal of the first MOS transistor becomes substantially a power source voltage when the power source voltage is applied to the high voltage reception terminal.

* * * * *